US008629537B2

(12) United States Patent
Camacho et al.

(10) Patent No.: US 8,629,537 B2
(45) Date of Patent: Jan. 14, 2014

(54) PADLESS DIE SUPPORT INTEGRATED CIRCUIT PACKAGE SYSTEM (75) Inventors: Zigmund Ramirez Camacho, Singapore (SG); Henry D. Bathan, Singapore (SG); Arnel Trasporto, Singapore (SG); Jeffrey D. Punzalan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 1253 days.

(21) Appl. No.: 11/339,176

(22) Filed: Jan. 23, 2006

(65) Prior Publication Data

US 2007/0170555 A1    Jul. 26, 2007

(51) Int. Cl.
*H01L 23/495* (2006.01)
(52) U.S. Cl.
USPC ........... 257/666; 257/668; 257/676; 257/684; 257/787; 257/E23.034; 257/E23.046; 257/E23.124; 257/E21.505; 257/E23.039; 257/E23.061; 438/124; 438/123; 438/111
(58) Field of Classification Search
USPC .......... 257/666, 668, 676, 684, 787, E23.034, 257/E23.046, E23.124, E21.505, E23.039, 257/E23.037, E23.061; 438/124, 111, 123
See application file for complete search history.

(56) References Cited

U.S. PATENT DOCUMENTS

| 4,663,833 | A | 5/1987 | Tanaka et al. |
| 5,436,492 | A | 7/1995 | Yamanaka |
| 5,541,446 | A | 7/1996 | Kierse |
| 5,893,723 | A | 4/1999 | Yamanaka |
| 5,929,514 | A | 7/1999 | Yalamanchili |
| 5,942,794 | A | 8/1999 | Okumura et al. |
| 6,048,754 | A | 4/2000 | Katayama et al. |
| 6,168,975 | B1 | 1/2001 | Zhang et al. |
| 6,200,828 | B1 | 3/2001 | Jeng et al. |
| 6,225,683 | B1 | 5/2001 | Yalamanchili et al. |
| 6,274,927 | B1 | 8/2001 | Glenn |
| 6,359,221 | B1 | 3/2002 | Yamada et al. |
| 6,433,424 | B1 | 8/2002 | Sammon |
| 6,472,729 | B1 * | 10/2002 | Oka .............................. 257/676 |
| 6,555,918 | B2 | 4/2003 | Masuda et al. |
| 6,894,376 | B1 | 5/2005 | Mostafazadeh et al. |
| 6,906,424 | B2 | 6/2005 | Kinsman |
| 6,927,479 | B2 | 8/2005 | Ramakrishna |
| 7,102,159 | B2 | 9/2006 | Tsai et al. |
| 7,119,421 | B2 | 10/2006 | Rohrmoser et al. |
| 7,129,569 | B2 | 10/2006 | Punzalan et al. |
| 7,161,232 | B1 | 1/2007 | Lee et al. |
| 2003/0038361 | A1 | 2/2003 | Nakamura |
| 2004/0004275 | A1 | 1/2004 | Chen et al. |
| 2004/0155361 | A1 | 8/2004 | Minamio et al. |
| 2005/0248019 | A1 | 11/2005 | Chao et al. |

* cited by examiner

*Primary Examiner* — Meiya Li
(74) *Attorney, Agent, or Firm* — Ishimaru & Associates LLP (57) ABSTRACT An integrated circuit package system is provided forming a die support system from a padless lead frame having die supports with each substantially equally spaced from another, and attaching an integrated circuit die having a peripheral area on the die supports.

20 Claims, 8 Drawing Sheets

PADLESS DIE SUPPORT INTEGRATED CIRCUIT PACKAGE SYSTEM

TECHNICAL FIELD

The present invention relates generally to integrated circuit packages and more particularly to padless integrated circuit packages.

BACKGROUND ART

Modern consumer electronics, such as cellular phones, digital cameras, and music players, are packing more integrated circuits into an ever shrinking physical space with expectations for decreasing cost. Numerous technologies have been developed to meet these requirements. Some of the research and development strategies focus on new technologies while others focus on improving the existing and mature technologies. Research and development in the existing technologies may take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. Still the demand continues for lower cost, smaller size and more functionality. Continued integration of functions into a single integrated circuit increases the integrated circuit size necessitating a more expensive package or a higher profile package.

A variation of existing technologies uses mature package technologies with thinned wafers in an attempt to reduce both the cost and the package height. However, wafer thinning adds additional steps and the thinned wafers are prone to handling and manufacturing problems resulting in damaged wafers, reduced yields, and higher cost. Another variation of existing technologies uses padless, no die-attach paddle or die paddle, packages and support the integrated circuit with the lead fingers in an attempt to reduce the package height. However, the integrated circuit support from the lead fingers pose both manufacturing yield problems, such as package warpage resulting in delamination of the integrated circuit from the lead fingers, and electrical performance problems, such as electromagnetic coupling from alternating currents in lead finger stubs under the integrated circuit.

Thus, a need still remains for an integrated circuit package system providing low cost, low profile, and high yield as well as providing robust electrical performance. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides forming a die support system from a padless lead frame having die supports with each substantially equally spaced from another, and attaching an integrated circuit die having a peripheral area on the die supports.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Figure 1:
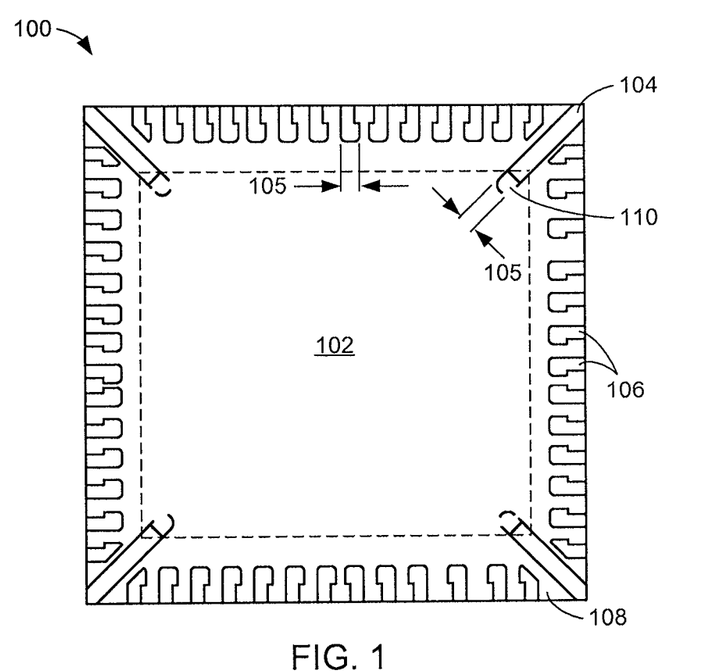
FIG. 1 is a plan view of a die bar support system in an integrated circuit package system in an embodiment of the present invention.

Referring now to FIG. 1, therein is shown a plan view of a die bar support system 100 in an integrated circuit package system in an embodiment of the present invention. The plan view depicts an integrated circuit die 102 on die bars 104 and lead fingers 106 along the edges of the integrated package system 100. The die bars 104 having top surface length-wise dimensions of varying lengths and width-wise dimensions being defined as equal widths 105 along their length-wise dimensions. A molding compound 108 encases the integrated circuit die 102, the die bars 104, and the lead fingers 106. The die bars 104 may be formed from extensions to the tie bars of the lead frame (not shown), wherein lengths of the die bars 104 extend to the corners of the integrated circuit die 102. The number of the die bars 104, such as four instance of the die bars 104, of the die bar support system 100 may equal the number of edges of the integrated circuit die 102 and each of the die bars 104 is substantially equally spaced from each other providing maximum support to the integrated circuit die 102.

The integrated circuit die 102 attaches to the die bars 104 with a bonding material 110, such as a B-stage elastomer adhesive, a dispensed snap curable die-attach adhesive, a quick setting cyanoacrylate based adhesive, or solder. Lengths of the lead fingers 106 are such that the lead fingers 106 do not extend to contact the peripheral area of the integrated circuit die 102. The lead fingers 106 electrically connect to the integrated circuit die 102 with interconnects (not shown).

The die bar support system 100 enables a padless integrated circuit package system eliminating problems or constraints, such as die-attach paddle (DAP) to epoxy molding compound (EMC) delamination, epoxy fillet height requirements, or epoxy coverage. As will be described in more detailed later, the die bar support system 100 provides low package height alleviating the need to thin wafers or the amount of thinning required as well as alleviating the severity with manufacturing and handling problems that have plagued thinned wafers. The pursuit of lower package height may be achieved in conjunction with thinned wafers. The die bar support system 100 alleviates the need for superior fillet control when processing very thin integrated circuit dies (not shown).

The bonding material 110 on the die bars 104 may be snap-cured or need not undergo curing to substantially eliminate epoxy cure related voids and delamination. As will be described in more detailed later, the snap-cure/non-cure feature may also be to enable immediate wire bonding without the need for the adhesive to reach its fully cured, hardened and high elastic modulus state, which is otherwise essential for conventional packages. The amount of the bonding material 110 at the ends of the die bars 104 is covering less area on the die bars 104 than the total area of the die bars 104 that is under the integrated circuit die 102 and is substantially less than the amount needed for DAP application reducing the high stress points and material mismatch areas. The reduction of the bonding material 110 also improves epoxy coverage control by reducing epoxy overflow and contamination.

The die bar support system 100 provides a substantial stable support structure for the integrated circuit die 102 with few contact points of the die bars 104. The reduced number of contact points decreases the potential of delamination of the integrated circuit die 102 off the die bars 104. The die bar support system 100 also provides improved results in moisture sensitivity level (MSL) testing.

Figure 2:
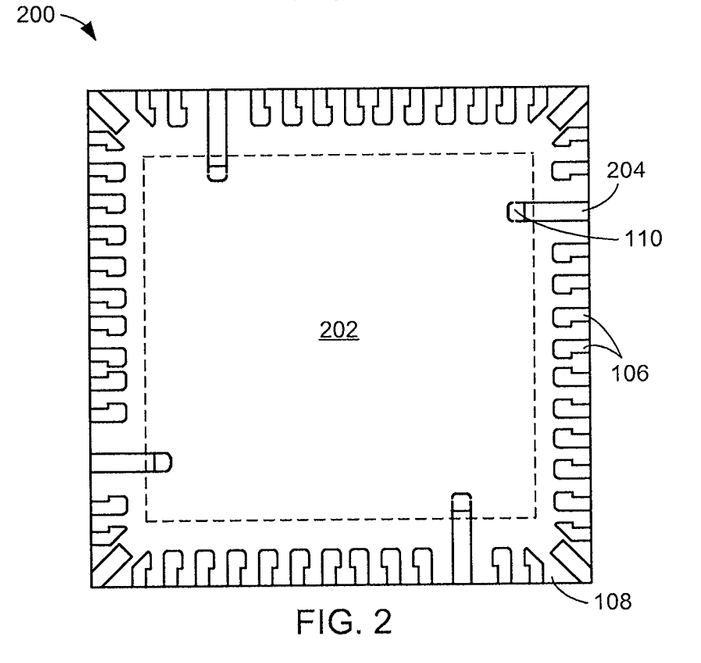
FIG. 2 is a plan view of a fused lead support system in an integrated circuit package system in an alternative embodiment of the present invention.

Referring now to FIG. 2, therein is shown a plan view of a fused lead support system 200 in an integrated circuit package system in an alternative embodiment of the present invention. The plan view depicts an integrated circuit die 202 on fused leads 204 and the lead fingers 106 along the edges and not the corners of the integrated package system. The molding compound 108 encases the integrated circuit die 202, the fused leads 204, and the lead fingers 106. The fused leads 204 may be formed from fusing extensions to some of the lead fingers 106 of the lead frame (not shown), wherein lengths of the fused leads 204 extend to the integrated circuit die 202. The number of the fused leads 204, such as four instance of the fused leads 204, of the fused lead support system 200 may equal the number of edges of the integrated circuit die 202 and each of the fused leads 204 is substantially equally spaced from each other providing maximum support to the integrated circuit die 202.

The integrated circuit die 202 attaches to the fused lead support system 200 with one of the fused leads 204 on each edge of the integrated circuit die 202. The integrated circuit die 202 attaches to the fused leads 204 with the bonding material 110. The lengths of the lead fingers 106 are such that the lead fingers 106 do not extend to contact the peripheral area of the integrated circuit die 202. The lead fingers 106 electrically connect to the integrated circuit die 202 with interconnects (not shown). The fused leads 204 function to provide support to the integrated circuit die 202 and not for electrical connection for the integrated circuit die 202 as the lead fingers 204.

The fused lead support system 200 enables a padless integrated circuit package system eliminating problems or constraints, such as die-attach paddle (DAP) to epoxy molding compound (EMC) delamination, epoxy fillet height requirements, or epoxy coverage. As will be described in more detail later, the fused lead support system 200 provides low package height alleviating the need to thin wafers or the amount of thinning required as well as alleviating the severity with manufacturing and handling problems that have plagued thinned wafers. The bonding material 110 on the fused leads 204 may be snap-cured or need not undergo curing to substantially eliminate epoxy cure related voids and delamination.

The amount of the bonding material 110 at the ends of the fused leads 204 is substantially less than the amount needed for DAP application reducing the high stress points and material mismatch areas. The reduction of the bonding material 110 also improves epoxy coverage control by reducing epoxy overflow and contamination.

The fused lead support system 200 provides a substantial stable support structure for the integrated circuit die 202 with few contact points of the fused leads 204. The reduced number of contact points decreases the potential of delamination of the integrated circuit die 202 off the fused leads 204. The fused lead support system 200 also provides improved results in moisture sensitivity level (MSL) testing.

For illustrative purpose, the fused leads 204 are described as being formed from fusing selected number of the lead fingers 106, although it is understood that the fused leads 204 may be formed by processes other than fusing, as well. Also for illustrative purpose, the lead fingers 106 in the FIG. 1 and FIG. 2 are described as the same, although it is understood the lead fingers 106 of the die bar support system 100 and the fused lead support system 200 may differ, as well.

Figure 3:
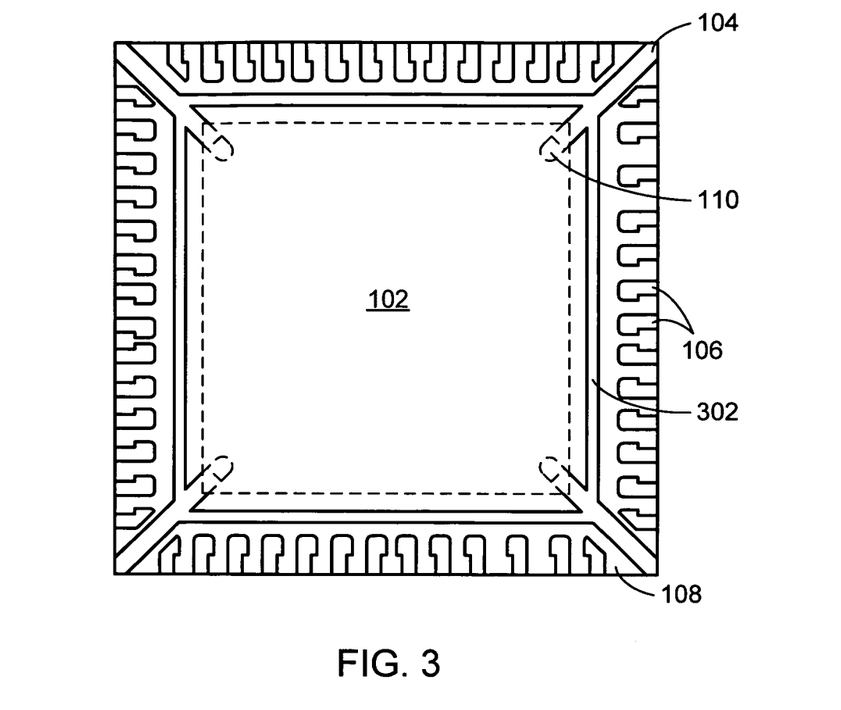
FIG. 3 is a plan view of the die bar support system with a ground ring in an integrated circuit package system.

Referring now to FIG. 3, therein is shown a plan view of the die bar support system 100 with a ground ring 302 in an integrated circuit package system. The plan view depicts the integrated circuit die 102 on the die bars 104 and the lead fingers 106 along the edges of the integrated package system. The molding compound 108 encases the integrated circuit die 102, the die bars 104, the ground ring 302, and the lead fingers 106. The ground ring 302 provides additional electromagnetic (EM) shielding to the integrated circuit die 102 from the alternating currents on the lead fingers 106 as well as provides potential ground bonding sites. The ground ring 302 also connects the die bars 104, wherein lengths of the die bars 104 extends to the corners of the integrated circuit die 102 and the ground ring 302 is between the integrated circuit die 102 and the lead fingers 106.

The integrated circuit die 102 attaches to the die bars 104 with the bonding material 110. The lengths of the lead fingers 106 are such that the lead fingers 106 do not extend to contact the ground ring 302. The lead fingers 106 may electrically connect to the integrated circuit die 102 or the ground ring 302 with interconnects (not shown).

The die bar support system 100 with the ground ring 302 enables a padless integrated circuit package system eliminating problems or constraints, such as die-attach paddle (DAP) to epoxy molding compound (EMC) delamination, epoxy fillet height requirements, or epoxy coverage. As will be described in more detailed later, the die bar support system 100 provides low package height alleviating the need to thin wafers or the amount of thinning required as well as alleviating the severity with manufacturing and handling problems that have plagued thinned wafers. The bonding material 110 on the die bar support # may be snap-cured or need not undergo curing to substantially eliminate epoxy cure related voids and delamination.

Figure 4:
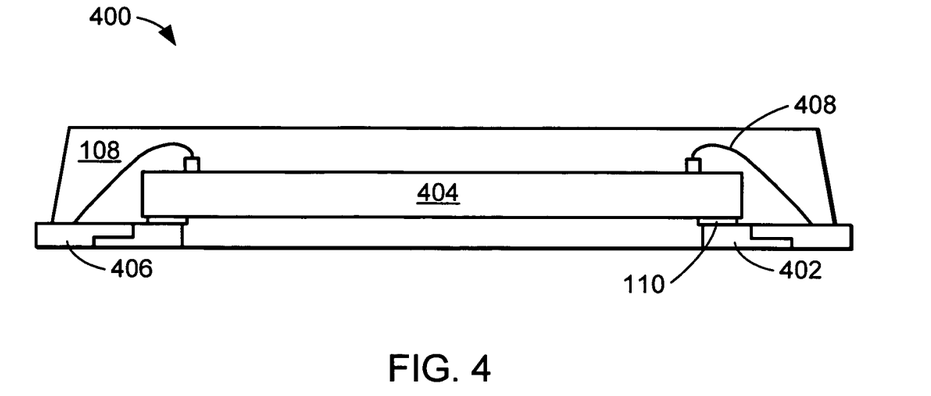
FIG. 4 is a cross-sectional view of a first integrated circuit package system with a first die-support.

Referring now to FIG. 4, therein is shown a cross-sectional view of a first integrated circuit package system 400 with a first die-support 402. The first integrated circuit package system 400 includes the an integrated circuit die 404 attached to the first die-support 402 with the bonding material 110 and electrically connected to lead fingers 406 of the padless lead frame by electrical interconnects 408, such as bond wires. The molding compound 108 encapsulates the integrated circuit die 404, the electrical interconnects 408, the first die-support 402, and the lead fingers 406. The bottoms of the lead fingers 406 are exposed for connections to the next system level (not shown), such as a printed circuit board. The bottom of the first die-support 402 may be exposed for connections to the next system level (not shown), such as a printed circuit board.

The top and bottom surfaces of the first die-support 402 are substantially in the same horizontal plane as the top and bottom surfaces of the lead fingers 406, respectively. The bonding material 110 on the first die-support 402 elevates the integrated circuit die 404 above the lead fingers 406. This elevation allows the integrated circuit die 404 to potentially overhang above the lead fingers 406 without contact.

Figure 5:
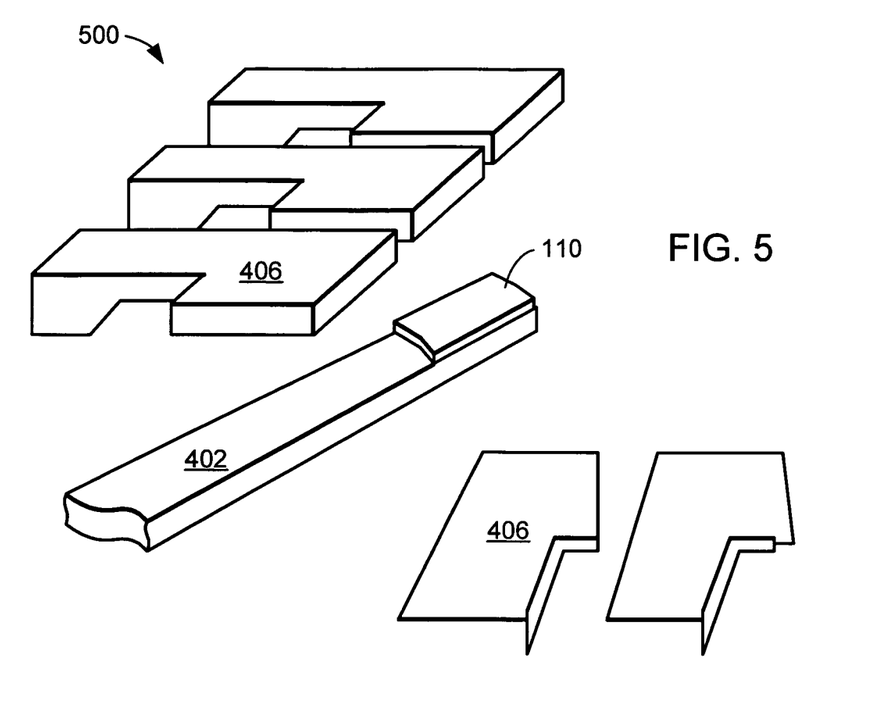
FIG. 5 is a schematic view of a portion of a first die bar support system with the first die-support of FIG. 4.

Referring now to FIG. 5, therein is shown a schematic view of a portion of a first die bar support system 500 with the first die-support 402 of FIG. 4. The schematic view depicts one corner of the first die bar support system 500 with the first die-support 402, such as a die bar, extending from the tie bar and the lead fingers 406. The length of the first die-support 402 is such that the first die-support 402 extends to the corner of the integrated circuit die 404 of FIG. 4. The bonding material 110 is pre-applied on the end of the first die-support 402 for holding, supporting, and elevating the integrated circuit die 404 when attached. For illustrative purpose, one corner of the first die bar support system 500 is shown, although it is understood that the other corners of the first die bar support system 500 have substantially the same features, as well.

Figure 6:
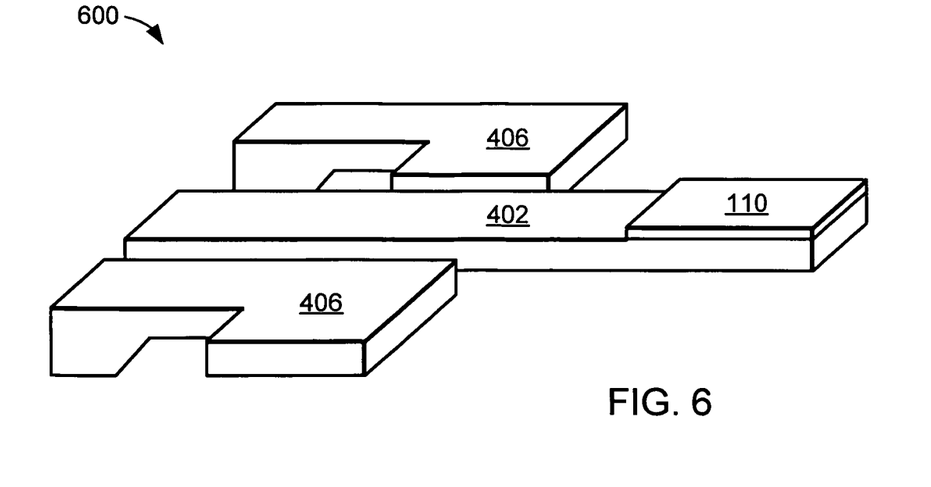
FIG. 6 is a schematic view of a portion of a first fused lead support system with the first die-support of FIG. 4.

Referring now to FIG. 6, therein is shown a schematic view of a portion of a first fused lead support system 600 with the first die-support 402 of FIG. 4. The schematic view depicts one edge of the first fused lead support system 600 with the first die-support 402, such as a fused lead, extending beyond the lead fingers 406. The length of the first die-support 402 is such that the first die-support 402 extends to an edge of the integrated circuit die 404 of FIG. 4. The bonding material 110 is pre-applied on the end of the first die-support 402 for holding, supporting, and elevating the integrated circuit die 404 when attached. For illustrative purpose, one edge of the first fused lead support system 600 is shown, although it is understood that the other edges of the first fused lead support system 600 have substantially the same features, as well.

Figure 7:
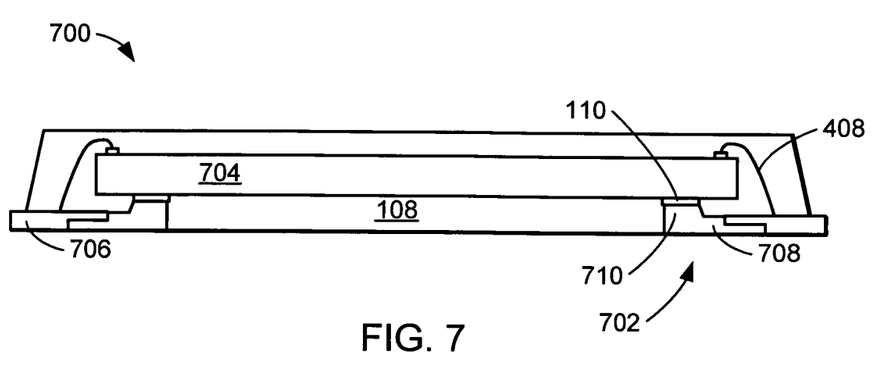
FIG. 7 is a cross-sectional view of a second integrated circuit package system with a second die-support.

Referring now to FIG. 7, therein is shown a cross-sectional view of a second integrated circuit package system 700 with a second die-support 702. The second integrated circuit package system 700 includes the an integrated circuit die 704 attached to the second die-support 702 with the bonding material 110 and electrically connected to lead fingers 706 of the padless lead frame by the electrical interconnects 408, such as bond wires. The molding compound 108 encapsulates the integrated circuit die 704, the electrical interconnects 408, the second die-support 702, and the lead fingers 706. The bottoms of the lead fingers 706 are exposed for connections to the next system level (not shown), such as a printed circuit board. The bottom of the second die-support 702 may be exposed for connections to the next system level (not shown), such as a printed circuit board.

The bottom surface of the second die-support 702 is substantially in the same horizontal plane as the bottom surface of the lead fingers 706. The top surface of a lower portion 708 of the second die-support 702 is substantially in the same horizontal plane as the top surface of the lead fingers 706. The lower portion 708 of the second die-support 702 may be formed with a number of processes, such as half etching. The bonding material 110 is applied on an elevated end 710 of the second die-support 702 further elevating, from the elevated end 710 of the second die-support 702, the integrated circuit die 704 above the lead fingers 706. This elevation allows the integrated circuit die 704 to potentially overhang above the lead fingers 706 without contact.

Figure 8:
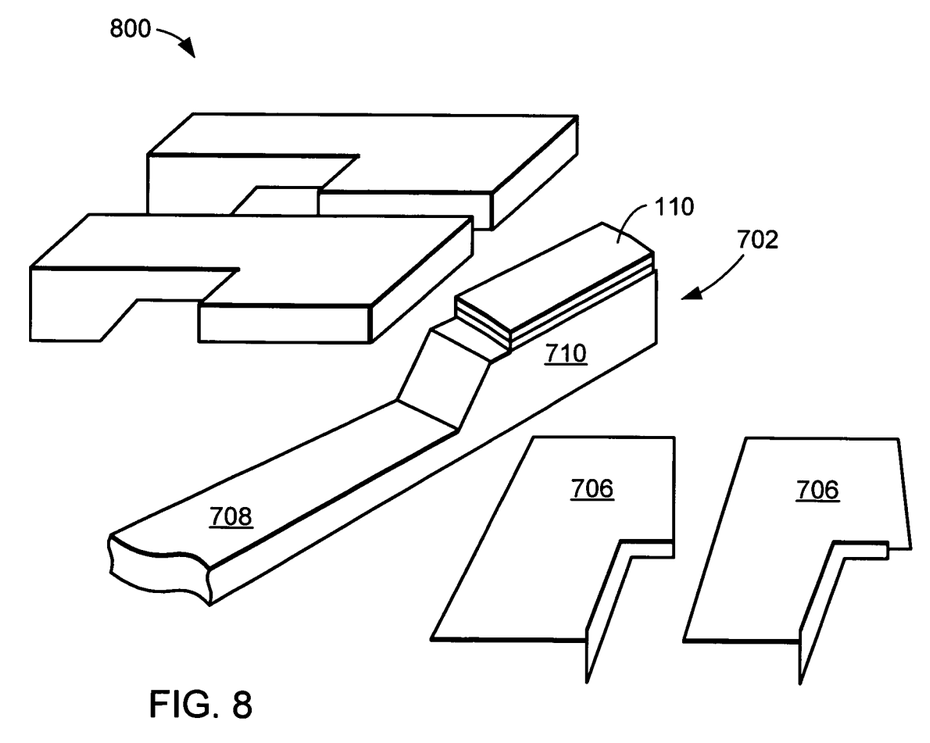
FIG. 8 is a schematic view of a portion of a second die bar support system with the second die-support of FIG. 7.

Referring now to FIG. 8, therein is shown a schematic view of a portion of a second die bar support system 800 with the second die-support 702 of FIG. 7. The schematic view depicts one corner of the second die bar support system 800 with the second die-support 702, such as a die bar, extending from the tie bar. The length of the second die-support 702 is such that the second die-support 702 extends to the corner of the integrated circuit die 704 of FIG. 7. The bonding material 110 is pre-applied on the elevated end 710 of the second die-support 702 for holding, supporting, and elevating the integrated circuit die 704 when attached and is not applied on the lower portion 708. For illustrative purpose, one corner of the second die bar support system 800 is shown, although it is understood that the other corners of the second die bar support system 800 have substantially the same features, as well.

Figure 9:
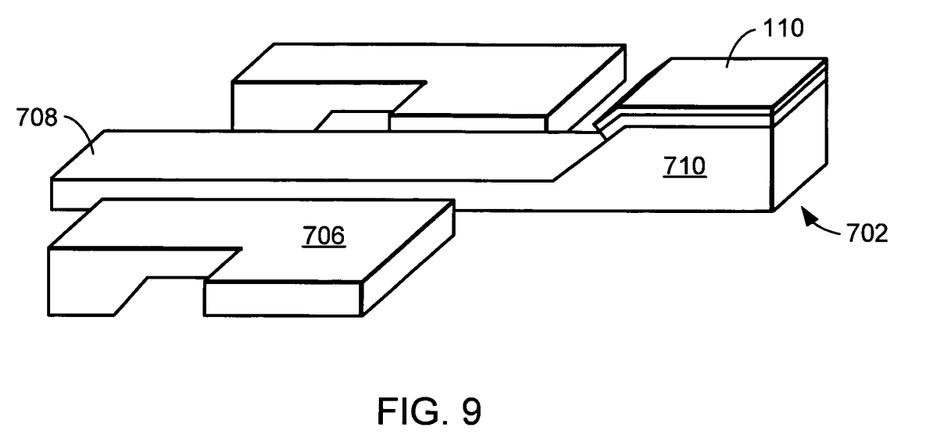
FIG. 9 is a schematic view of a portion of a second fused lead support system with a second die-support of FIG. 7.

Referring now to FIG. 9, therein is shown a schematic view of a portion of a second fused lead support system 900 with the second die-support 702 of FIG. 7. The schematic view depicts one edge of the second fused lead support system 900 with the second die-support 702, such as a fused lead, extending beyond the lead fingers 706. The length of the second die-support 702 is such that the second die-support 702 extends to an edge of the integrated circuit die 704 of FIG. 7. The bonding material 110 is pre-applied on the elevated end 710 of the second die-support 702 for holding, supporting, and elevating the integrated circuit die 704 when attached and is not applied to the lower portion 708. For illustrative purpose, one edge of the second fused lead support system 900 is shown, although it is understood that the other edges of the second fused lead support system 900 have substantially the same features, as well.

Figure 10:
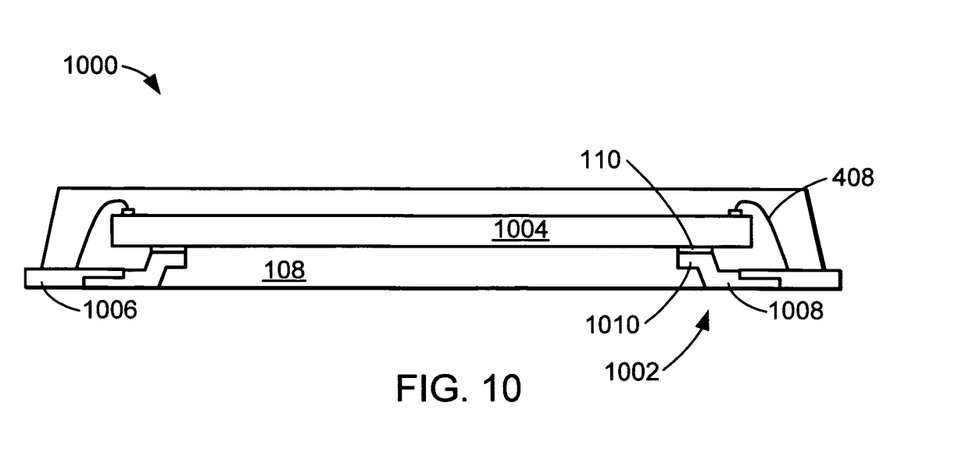
FIG. 10 is a cross-sectional view of a third integrated circuit package system with a third die-support.

Referring now to FIG. 10, therein is shown a cross-sectional view of a third integrated circuit package system 1000 with a third die-support 1002. The third integrated circuit package system 1000 includes the an integrated circuit die 1004 attached to the third die-support 1002 with the bonding material 110 and electrically connected to lead fingers 1006 of the padless lead frame by the electrical interconnects 408, such as bond wires. The molding compound 108 encapsulates the integrated circuit die 1004, the electrical interconnects 408, the third die-support 1002, and the lead fingers 1006. The bottoms of the lead fingers 1006 are exposed for connections to the next system level (not shown), such as a printed circuit board. The bottom of the third die-support 1002 may be exposed for connections to the next system level (not shown), such as a printed circuit board. The bottom surface of a lower portion 1008 of the third die-support 1002 is substantially in the same horizontal plane as the bottom surface of the lead fingers 1006. The top surface of the lower portion 1008 of the third die-support 1002 is substantially in the same horizontal plane as the top surface of the lead fingers 1006. An elevated end 1010 of the third die-support 1002 may be formed with a number of processes, such as bending or folding. The bonding material 110 is applied on the elevated end 1010 of the third die-support 1002 further elevating, from the elevated end 1010 of the third die-support 1002, the integrated circuit die 1004 above the lead fingers 1006. This elevation allows the integrated circuit die 1004 to potentially overhang above the lead fingers 1006 without contact.

Figure 11:
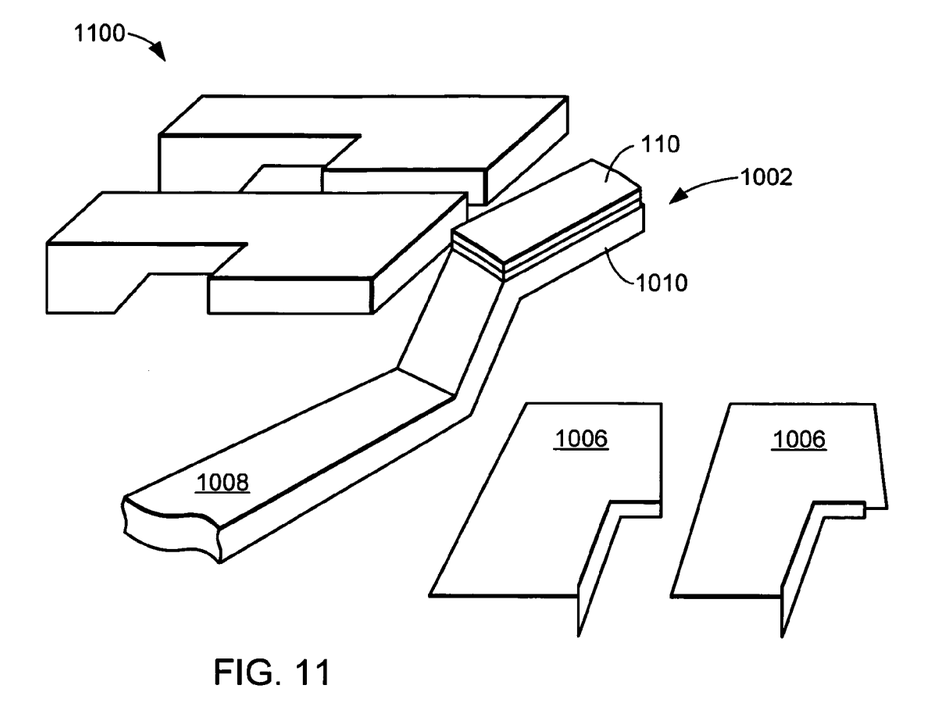
FIG. 11 is a schematic view of a portion of a third die bar support system with a third die-support of FIG. 10.

Referring now to FIG. 11, therein is shown a schematic view of a portion of a third die bar support system 1100 with the third die-support 1002 of FIG. 10. The schematic view depicts one corner of the third die bar support system 1100 with the third die-support 1002, such as a die bar, extending from the tie bar. The length of the third die-support 1002 is such that the third die-support 1002 extends to the corner of the integrated circuit die 1004 of FIG. 10. The bonding material 110 is pre-applied on the elevated end 1010 of the third die-support 1002 for holding, supporting, and elevating the integrated circuit die 1004 when attached and is not applied on the lower portion 1008. For illustrative purpose, one corner of the third die bar support system 1100 is shown, although it is understood that the other corners of the third die bar support system 1100 have substantially the same features, as well.

Figure 12:
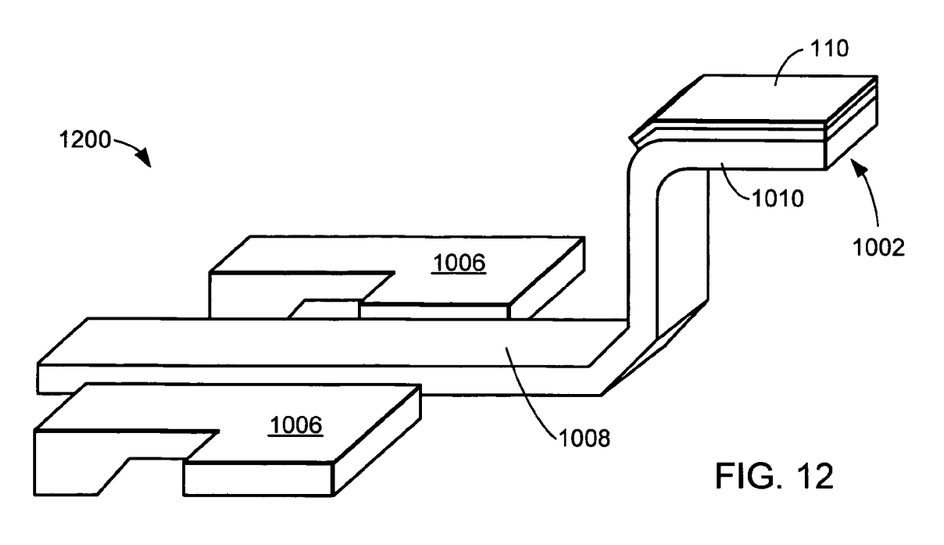
FIG. 12 is a schematic view of a portion of a third fused lead support system with a third die-support of FIG. 10.

Referring now to FIG. 12, therein is shown a schematic view of a portion of a third fused lead support system 1200 with the third die-support 1002 of FIG. 10. The schematic view depicts one edge of the third fused lead support system 1200 with the third die-support 1002, such as a fused lead, extending beyond the lead fingers 1006. The length of the third die-support 1002 is such that the third die-support 1002 extends to an edge of the integrated circuit die 1004 of FIG. 10. The bonding material 110 is pre-applied on the elevated end 1010 of the third die-support 1002 for holding, supporting, and elevating the integrated circuit die 1004 when attached and is not applied to the lower portion 1008. For illustrative purpose, one edge of the third fused lead support system 1200 is shown, although it is understood that the other edges of the third fused lead support system 1200 have substantially the same features, as well.

Figure 13:
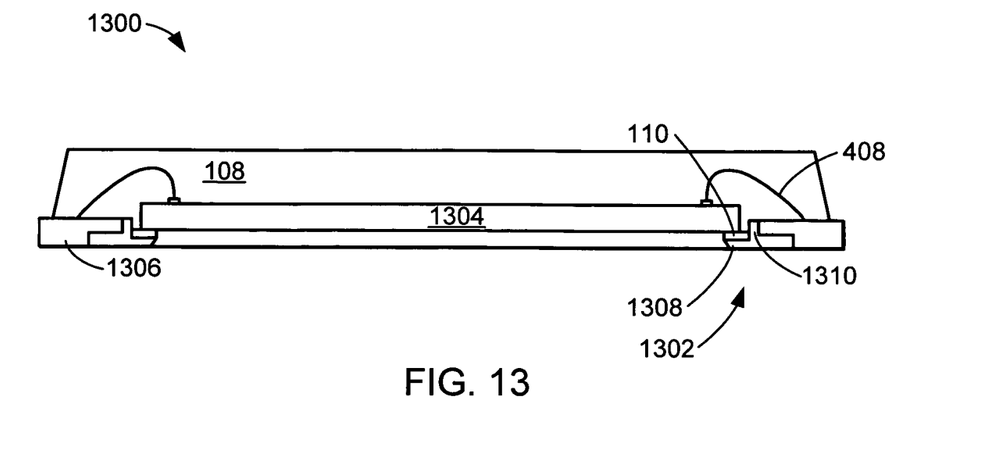
FIG. 13 is a cross-sectional view of a fourth integrated circuit package system with a fourth die-support.

Referring now to FIG. 13, therein is shown a cross-sectional view of a fourth integrated circuit package system 1300 with a fourth die-support 1302. The fourth integrated circuit package system 1300 includes the an integrated circuit die 1304 attached to the fourth die-support 1302 with the bonding material 110 and electrically connected to lead fingers 1306 of the padless lead frame by the electrical interconnects 408, such as bond wires. The molding compound 108 encapsulates the integrated circuit die 1304, the electrical interconnects 408, the fourth die-support 1302, and the lead fingers 1306. The bottoms of the lead fingers 1306 are exposed for connections to the next system level (not shown), such as a printed circuit board. The bottom of the fourth die-support 1302 may be exposed for connections to the next system level (not shown), such as a printed circuit board.

The bottom surface of a lower end 1308 of the fourth die-support 1302 is substantially in the same horizontal plane as the bottom surface of the lead fingers 1306. The top surface of a higher portion 1310 of the fourth die-support 1302 is substantially in the same horizontal plane as the top surface of the lead fingers 1306. The lower end 1308 of the fourth die-support 1302 may be formed with a number of processes, such as half etching. The bonding material 110 is applied on the lower end 1308 of the fourth die-support 1302. The integrated circuit die 1304 attaches to the bonding material 110 below the top surface of the lead fingers 1306. This lowered elevation allows for a lower package height of the fourth integrated circuit package system 1300 and reduce the amount of thinning needed for the integrated circuit die 1304.

Figure 14:
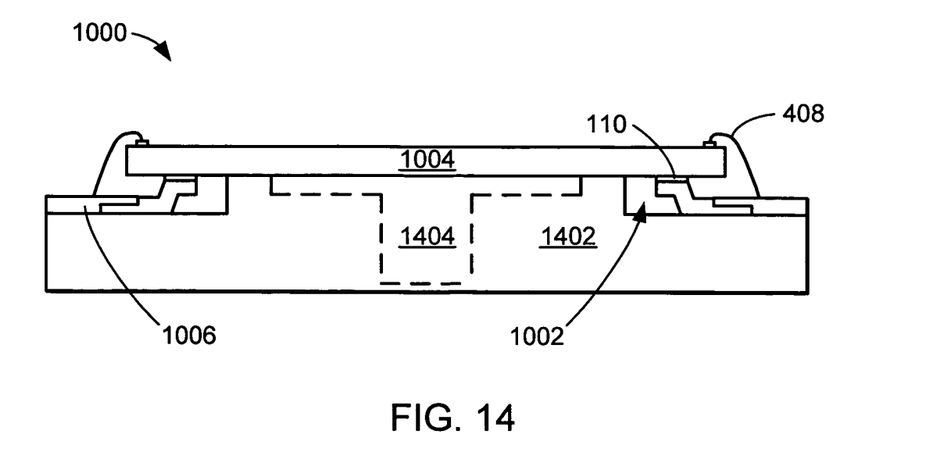
FIG. 14 is a cross-sectional view of the third integrated circuit package system of FIG. 10 in a wire bonding phase.

Referring now to FIG. 14, therein is shown a cross-sectional view of the third integrated circuit package system 1000 of FIG. 10 in a wire bonding phase. The cross-sectional view depicts a bare die back wire bonding or padless wire bonding of the integrated circuit die 1004. A heater block 1402 with a vacuum orifice 1404 allows for a vacuum force to hold the integrated circuit die 1004 on the bonding material 110 on the elevated end of the third die-support 1002. The electrical interconnects 408 are attached to the integrated circuit die 1004 and the lead fingers 1006. The bare die back wire bonding or padless wire bonding processes may simultaneously attaches the integrated circuit die 1004 to the third die-support 1002 and bonds the wires in an integrated in-line system reducing manufacturing complexity and cost.

The bonding material 110 on the die-support 1002 may be snap cured or need not undergo curing to substantially eliminate epoxy cure related voids and delamination. The snap-cure/non-cure feature may also be to enable immediate wire bonding without the need for the adhesive to reach its fully cured, hardened and high elastic modulus state, which is otherwise essential for conventional packages otherwise bouncing at wire bonding will occur.

In this invention, the bare die back wire bonding or padless wire bonding processes enables wire bonding even at low modulus adhesive without resulting to bouncing. The invention enables the properties of the bonding material 110, such as the epoxy adhesive material, to be considered less critical for wire bonding performance.

The bare die back wire bonding or padless wire bonding processes the integrated circuit die 1004 may be held by the bonding material 110 with an amount of adhesive strength enough to keep the integrated circuit die 1004 in place, and need not be strong enough to withstand the forces of wire bonding. The vacuum force from the heater block' 1402 holds the integrated circuit die 1004 for wire bonding. The vacuum force should be strong enough to keep the integrated circuit die 1004 stable during the wire bonding process.

Figure 15:
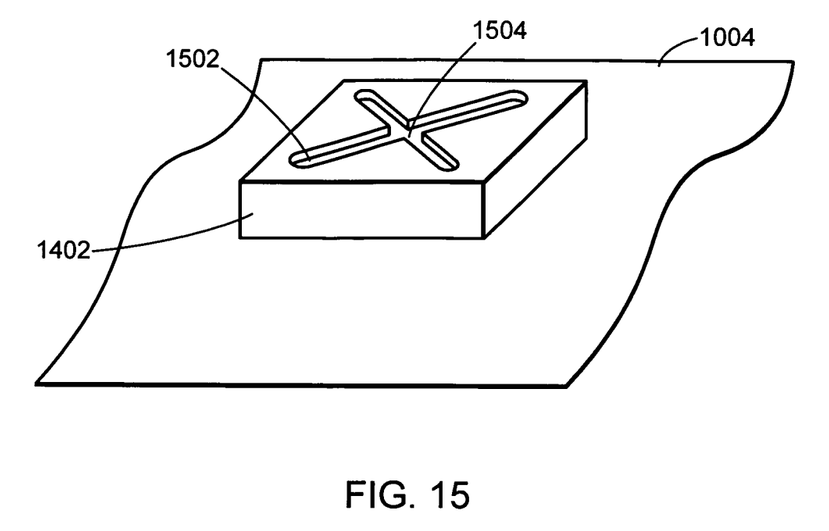
FIG. 15 is a schematic view of the heater block with the vacuum orifice.

Referring now to FIG. 15, therein is shown a schematic view of the heater block 1402 with the vacuum orifice 1404. The schematic view depicts the top surface of the heater block 1402 that contacts the back side of the integrated circuit die 1004 of FIG. 14. A recess 1502 on the top surface of the heater block 1402, in a configuration of intersecting segments, provides substantially uniform vacuum force to the integrated circuit die 1004 preventing cracking or warpage while achieving sufficient surface contact for the heating function. A vacuum hole 1504 is in the recess 1502 at the intersection of the line segments.

Figure 16:
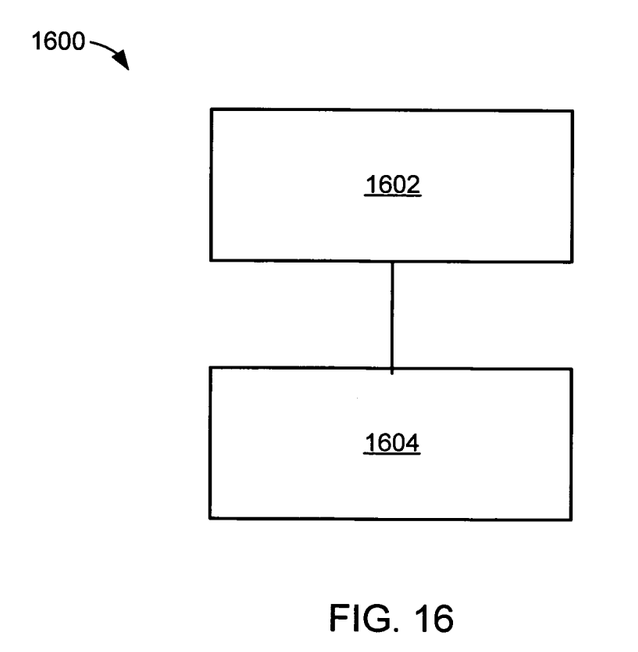
FIG. 16 is a flow chart of an integrated circuit package system for manufacture of the integrated circuit package with the die bar support in an embodiment of the present invention.

Referring now to FIG. 16, therein is shown a flow chart of an integrated circuit package system 1600 for manufacture of the die bar support system 100 for the integrated circuit package system in an embodiment of the present invention. The system 1600 includes forming a die support system from a padless lead frame having die supports with each substantially equally spaced from another in a block 1602; and attaching an integrated circuit die having a peripheral area on the die supports in a block 1604.

It has been discovered that the present invention thus has numerous aspects.

It has been discovered that the die support system, such as a die bar support system or a fused lead support system, provides a low cost packaging solution with a robust assembly process yielding high and consistent MSL performance, and provides a "cure-less"/instant adhesive die-attach and wire bonding in-line process.

It has been discovered that the present invention enables a padless integrated circuit package system eliminating problems or constraints associated with DAP application, contamination, and reliability. The die support system also enable stream-lining the integrated circuit packaging by simultaneously performing die-attach and wire-bonding.

It has been also discovered that the die support system alleviates the need for superior fillet control when processing very thin integrated circuit dies. Thinner and thinner die thickness are desired in the pursuit of thinner package heights. One constraint in thin die processing at die-attach using conventional methods is keeping fillet from overflowing onto the die (due to its limited thickness). Hence, the invention supports thin package heights with the thin die processed such that fillet control becomes less critical.

An aspect is that the present invention is that the die support system enables a padless integrated circuit package system eliminating problems or constraints, such as die-attach paddle (DAP) to epoxy molding compound (EMC) delamination, epoxy fillet height requirements, or epoxy coverage. The adhesive on the die bar support may be snap-cured or need not undergo curing to substantially eliminate epoxy cure related voids and delamination.

Another aspect of the present invention is that the amount of the adhesive at the ends of the die-supports is substantially less than the amount needed for DAP application reducing the high stress points and material mismatch areas. The reduction of the adhesive also improves epoxy coverage control by reducing epoxy overflow and contamination.

Yet another aspect of the present invention is that the die support system provides a substantial stable support structure for the integrated circuit die with few contact points with the die-supports. The reduced number of contact points decreases the potential of delamination of the integrated circuit die off the die-supports. The die support system also provides improved results in moisture sensitivity level (MSL) testing.

Yet another aspect of the present invention is that the die support system provides low package height alleviating the need to thin wafers or the amount of thinning required as well as alleviating the severity with manufacturing and handling problems that have plagued thinned wafers.

Thus, it has been discovered that the padless die support integrated circuit package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit package in packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

The invention claimed is:

1. An integrated circuit package method comprising:
   forming a die support system from a padless lead frame having lead fingers and die supports with each die support substantially equally spaced from another, the die supports having equal widths;
   applying bonding material to the die supports; and
   attaching an integrated circuit die having a peripheral area to the bonding material on the die supports with the bonding material covering less area on the die supports than the total area of the die supports directly under the integrated circuit die.

2. The method as claimed in claim 1 wherein forming the die support system from the padless lead frame having the die supports with each substantially equally spaced from another comprises forming die bars to support the integrated circuit die at the corners.

3. The method as claimed in claim 1 wherein forming the die support system from the padless lead frame having the die supports with each substantially equally spaced from another comprises half etching a lower end of the die supports with the integrated circuit die on the lower end.

4. The method as claimed in claim 1 wherein forming the die support system from the padless lead frame having the die supports with each substantially equally spaced from another comprises half etching a lower portion of the die supports with the integrated circuit die on an elevated end of the die supports.

5. The method as claimed in claim 1 wherein forming the die support system from the padless lead frame having the die supports with each substantially equally spaced from another comprises bending an elevated end bend of the die supports for the integrated circuit die on the elevated end of the die supports.

6. An integrated circuit package method comprising:
   forming a die support system from a padless lead frame having lead fingers and die supports with a number of the die supports equal to the number of sides of an integrated circuit die with each die support substantially equally spaced from another, the die supports having equal widths;

applying bonding material to the die supports; and attaching the integrated circuit die having a peripheral area to the bonding material on the die supports with the bonding material covering less area on the die supports than the total area of the die supports directly under the integrated circuit die.

7. The method as claimed in claim 6 wherein forming the die support system from the padless lead frame having the die supports comprises forming fused leads to support the integrated circuit die at the edges.

8. The method as claimed in claim 6 wherein attaching the integrated circuit die comprises attaching each of the die supports on each corner of the integrated circuit die, respectively.

9. The method as claimed in claim 6 wherein attaching the integrated circuit die comprises attaching each of the die supports on each side of the integrated circuit die, respectively.

10. The method as claimed in claim 6 further comprising:
forming lead fingers from the padless lead frame; and
connecting electrical interconnects between the lead fingers and the integrated circuit die with a heater block having a vacuum orifice to attach the integrated circuit die to the die supports.

11. An integrated circuit package system comprising: a die support system from a padless lead frame having lead fingers and die supports with each substantially equally spaced from another, the die supports having equal widths, and the die support system with a bonding material; and
an integrated circuit die having a peripheral area on the die supports and the bonding material covers less area on the die supports than the total area of the die supports directly under the integrated circuit die.

12. The system as claimed in claim 11 wherein the die support system from the padless lead frame having the die supports with each substantially equally spaced from another comprises die bars to support the integrated circuit die at the corners.

13. The system as claimed in claim 11 wherein the die support system from the padless lead frame having the die supports with each substantially equally spaced from another comprises a lower end of the die supports with the integrated circuit die on the lower end.

14. The system as claimed in claim 11 wherein the die support system from the padless lead frame having the die supports with each substantially equally spaced from another comprises a lower portion of the die supports with the integrated circuit die on an elevated end of the die supports.

15. The system as claimed in claim 11 wherein the die support system from the padless lead frame having the die supports with each substantially equally spaced from another comprises an elevated end bend of the die supports for the integrated circuit die on the elevated end of the die supports.

16. The system as claimed in claim 11 wherein:
the die support system from the padless lead frame having the die supports with each substantially equally spaced from another have the die supports similar in length to each other, and
the integrated circuit die having the peripheral area on the die supports with the non-active side of the integrated circuit die on the die supports,
further comprising:
a number of the die supports equal to the number of sides of the integrated circuit die.

17. The system as claimed in claim 16 wherein the die support system from the padless lead frame having the die supports comprises fused leads to support the integrated circuit die at the edges.

18. The system as claimed in claim 16 wherein each of the die supports is on each corner of the integrated circuit die, respectively.

19. The system as claimed in claim 16 wherein each of the die supports is on each side of the integrated circuit die, respectively.

20. The system as claimed in claim 16 further comprising:
lead fingers of the padless lead frame; and
electrical interconnects between the lead fingers and the integrated circuit die.

* * * * *